United States Patent [19]
Zagar et al.

[11] Patent Number: 5,812,488
[45] Date of Patent: *Sep. 22, 1998

[54] SYNCHRONOUS BURST EXTENDED DATA OUT DRAM

[75] Inventors: Paul S. Zagar; Troy A. Manning; Todd Merritt, all of Boise, Id.

[73] Assignee: Micron Technology, Inc., Boise, Id.

[*] Notice: The term of this patent shall not extend beyond the expiration date of Pat. No. 5,668,773.

[21] Appl. No.: 811,696

[22] Filed: Mar. 5, 1997

Related U.S. Application Data

[63] Continuation of Ser. No. 552,199, Nov. 21, 1995, Pat. No. 5,668,773, and a continuation-in-part of Ser. No. 370,761, Dec. 23, 1994, Pat. No. 5,526,320.

[51] Int. Cl.$^6$ .................................................. G11C 8/00
[52] U.S. Cl. ...................... 365/233; 365/233.5; 365/236; 395/855
[58] Field of Search ............................... 365/233, 233.5, 365/238.5, 236; 395/855

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |

(List continued on next page.)

FOREIGN PATENT DOCUMENTS

| | | |
|---|---|---|
| 0468480 | 1/1992 | European Pat. Off. . |
| 19507562 | 9/1995 | Germany . |

OTHER PUBLICATIONS

"DRAM 1 Meg X 4 DRAM 5VEDO Page Mode", *1995 DRAM Data Book,*, pp. 1–1 thru 1–30,, (Micron Technology, I).

"Rossini, Pentium, PCI–ISA, Chip Set", *Symphony Laboratories,*, entire book.

"4 DRAM 1991", *Toshiba America Electronic Components, Inc.*, pp. A–137—A–159.

"Application Specific DRAM", *Toshiba America Electronic Components, Inc.*, C178, C–260, C 218, (1994).

"Burst DRAM Function & Pinout", *Oki Electric Ind., Co., Ltd., 2nd Presentation, Item#619*, (Sep. 1994).

"Hyper page mode DRAM", *8029 Electronic Engineering 66, No. 813*, Woolwich, London GB, pp. 47–48, (Sep. 1994).

"Mosel–Vitelic V53C8257H DRAM Specification Shhet, 20 pages, Jul. 02, 1994".

"Pipelined Burst DRAM", *Toshiba, JEDEC JC 42.3 Hawaii*, (Dec. 1994).

"Samsung Synchronous DRAM", *Samsung Electronics*, pp. 1–16, (Mar. 1993).

"Synchronous DRAM 2 MEG cx 8 SDRAM", *Micron Semiconductor, Inc.*, pp. 2–43 through 2–8.

Bursky, D., "Novel I/O Options and Innovative Architectures Let DRAMs Achieve SRAM Performance; Fast DRAMS can be swapped for SRAM Caches", *Electronic Design*, vol. 41, No. 15, Cleveland, Ohio, pp. 55–67, (Jul. 22, 1993).

Gowni, et al., "Synchronous Cache RAM with Burst ;Mode Access", *IEEE 1992 Custom Integrated Circuits Conference*, Boston USA, pp. 781–784, (May 1992).

Primary Examiner—Tan T. Nguyen
Attorney, Agent, or Firm—Schwegman, Lundberg, Woessner & Kluth, P.A.

[57] ABSTRACT

An integrated circuit memory device is described which can operate at high data speeds. The memory device can either store or retrieve data from the memory in a burst access operation. The burst operations latches a memory address from external address lines and internally generates additional memory addresses. A clock signal is provided to synchronize the burst operations. The clock signal is independent of an address latch signal used to latch an external address.

18 Claims, 7 Drawing Sheets

U.S. PATENT DOCUMENTS

| | | | |
|---|---|---|---|
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,870,622 | 9/1989 | Aria et al. | 365/230 |
| 4,875,192 | 10/1989 | Matsumoto | 365/193 |
| 4,984,217 | 1/1991 | Sato | 365/230 |
| 5,058,066 | 10/1991 | Yu | 365/189.05 |
| 5,083,296 | 1/1992 | Hara et al. | 365/230 |
| 5,126,975 | 6/1992 | Handy et al. | 365/230 |
| 5,210,723 | 5/1993 | Bates et al. | 365/238.5 |
| 5,267,200 | 11/1993 | Tobita | 365/189 |
| 5,268,865 | 12/1993 | Takasugi | 365/189 |
| 5,280,594 | 1/1994 | Young et al. | 711/157 |
| 5,305,284 | 4/1994 | Iwase | 365/238.5 |
| 5,319,759 | 6/1994 | Chan | 395/400 |
| 5,325,330 | 6/1994 | Morgan | 365/189.05 |
| 5,325,502 | 6/1994 | McLaury | 395/425 |
| 5,331,593 | 7/1994 | Merritt et al. | 365/189.05 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230 |
| 5,386,385 | 1/1995 | Stephens, Jr. | 365/189.05 |
| 5,392,239 | 2/1995 | Margulis et al. | 365/189 |
| 5,410,670 | 4/1995 | Hansen et al. | 395/425 |
| 5,452,261 | 9/1995 | Chung et al. | 365/233 |
| 5,457,659 | 10/1995 | Schaefer | 365/222 |
| 5,513,148 | 4/1996 | Zager | 365/233 |
| 5,526,320 | 6/1996 | Zagar et al. | 365/233.5 |

| Burst Length | Starting Column Address A₂ A₁ A₀ | Linear | Interleave |
|---|---|---|---|
| 2 | V V 0 | 0-1 | 0-1 |
| 2 | V V 1 | 1-0 | 1-0 |
| 4 | V 0 0 | 0-1-2-3 | 0-1-2-3 |
| 4 | V 0 1 | 1-2-3-0 | 1-0-3-2 |
| 4 | V 1 0 | 2-3-0-1 | 2-3-0-1 |
| 4 | V 1 1 | 3-0-1-2 | 3-2-1-0 |
| 8 | 0 0 0 | 0-1-2-3-4-5-6-7 | 0-1-2-3-4-5-6-7 |
| 8 | 0 0 1 | 1-2-3-4-5-6-7-0 | 1-0-3-2-5-4-7-6 |
| 8 | 0 1 0 | 2-3-4-5-6-7-0-1 | 2-3-0-1-6-7-4-5 |
| 8 | 0 1 1 | 3-4-5-6-7-0-1-2 | 3-2-1-0-7-6-5-4 |
| 8 | 1 0 0 | 4-5-6-7-0-1-2-3 | 4-5-6-7-0-1-2-3 |
| 8 | 1 0 1 | 5-6-7-0-1-2-3-4 | 5-4-7-6-1-0-3-2 |
| 8 | 1 1 0 | 6-7-0-1-2-3-4-5 | 6-7-4-5-2-3-0-1 |
| 8 | 1 1 1 | 7-0-1-2-3-4-5-6 | 7-6-5-4-3-2-1-0 |

FIG. 2

SYNCHRONOUS BURST EXTENDED DATA OUT DRAM

This Application is a continuation of U.S. patent application Ser. No. 08/552,199 filed Nov. 2, 1995, now U.S. Pat. No. 5,668,773 and is a continuation-in-part of U.S. application Ser. No. 08/370,761, filed of Dec. 23, 1994, now U.S. Pat. No. 5,526,320, and entitled "Burst EDO Memory Device," which is incorporated herein by reference.

FIELD OF THE INVENTION

This invention relates to synchronous memory devices and in particular to memory device architectures designed to provide high density data storage with high speed read and write access cycles.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (RAS*) is used to latch a row address portion of a multiplexed DRAM address. Multiple occurrences of the column address strobe (CAS*) are then used to latch multiple column addresses to access data within the selected row. On the falling edge of CAS* an address is latched, and the DRAM outputs are enabled. When CAS* transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. CAS* may be low for as little as 15 nanoseconds, and the data access time from CAS* to valid output data ($t_{CAC}$) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The CAS* signal for the odd addresses is turned off (high) when the CAS* signal for the even addresses is turned on (low). This interleaved memory system provides data access at twice the rate of either device alone. If the first CAS* is low for 20nanoseconds and then high for 20 nanoseconds while the second CAS* goes low, data can be accessed every 20 nanoseconds or 50 megahertz, If the access time from CAS* to data valid is fifteen nanoseconds, the data will be valid for only five nanoseconds at the end of each 20 nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after CAS* goes high until sometime after the next CAS* low pulse occurs, or until RAS* or the output enable (OE*) goes high. Determining when valid data will arrive at the outputs of a fast page mode or EDO DRAM can be a complex function of when the column address inputs are valid, when CAS* falls, the state of OE* and when CAS* rose in the previous cycle. The period during which data is valid with respect to the control line signals (especially CAS*) is determined by the specific implementation of the EDO mode, as adopted by the various DRAM manufacturers.

Yet another type of memory device is a burst EDO memory which adds the ability to address one column of a memory array and then automatically address additional columns in a pre-determined manner without providing the additional column addresses on external address lines. These memory devices use a column access input to access the memory array columns. For the reasons stated above, and for other reasons stated below which will become apparent to those skilled in the art upon reading and understanding the present specification, there is a need in the art for a memory device which can operate at high data rates in a clocked or synchronous manner.

SUMMARY OF THE INVENTION

The above mentioned problems with memory devices and other problems are addressed by the present invention and which will be understood by reading and studying the following specification. A memory device is described which uses a clock signal to synchronize a burst access memory.

In particular one embodiment of the present invention is a memory device comprising a plurality of addressable memory elements, and addressing circuitry. The addressing circuitry is adapted to receive a first memory element address in response to a transition of a clock signal and an address latch signal, and further adapted to generate a second memory element address in response to a subsequent transition of the clock signal.

In another embodiment, a synchronous memory device is described. This memory comprises a memory array having a plurality of addressable memory elements, a plurality of address inputs for receiving memory element addresses, and an address latch input for receiving an address latch signal. The memory also includes an address latch for receiving a first memory element address in response to a transition of a clock signal and the address latch signal, and an address generation circuit responsive to successive transitions of the clock signal and to the first memory element address for generating additional memory element addresses.

In yet another embodiment, a method of accessing a memory device is described. The method comprises the steps of receiving a first memory element address in response to a transition of a clock signal and an address latch signal, and generating additional memory element addresses in response to subsequent transitions of the clock signal.

In still another embodiment, a method of burst accessing a memory device is described. The method comprising the steps of receiving a first memory element address in response to a transition of a clock signal and an address latch signal, accessing first memory elements having the first memory element address, generating additional memory element addresses in response to subsequent transitions of the clock signal, and accessing additional memory elements having the additional memory element addresses.

BRIEF DESCRIPTION OF THE DRAWINGS

FIG. 2 illustrates linear and interleaved addressing sequences for the device of FIG. 1;

DETAILED DESCRIPTION OF THE PREFERRED EMBODIMENT

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
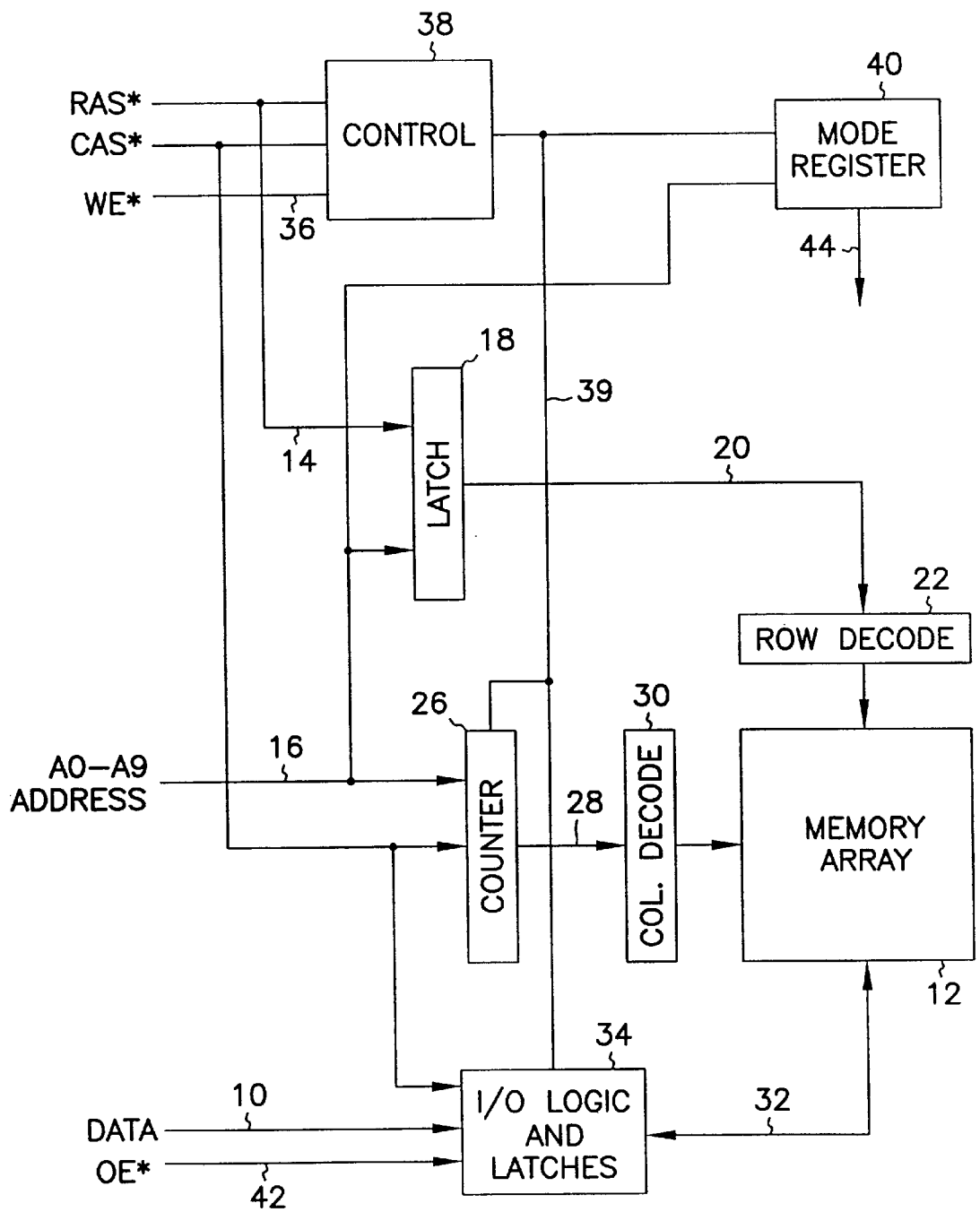
FIG. 1 is a block diagram of a memory device incorporating burst access.

FIG. 1 is a schematic representation of a sixteen megabit device designed to operate in a burst access mode. The device is organized as a 2 Meg×8 burst EDO DRAM having an eight bit data input/output path 10 providing data storage for 2,097,152 bytes of information in the memory array 12. An active-low row address strobe (RAS*) signal 14 is used to latch a first portion of a multiplexed memory address, from address inputs A0 through A10 16, in latch 18. The latched row address 20 is decoded in row decoder 22. The decoded row address is used to select a row of the memory array 12. An active-low column address strobe (CAS*) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with a clock signal after a predetermined number of clock cycle delays (latency). For a two cycle latency design, the first clock rising edge during a CAS* cycle is used to latch the initial address for the burst access. The first burst data from the memory is driven from the memory after the second clock falling edge, and remains valid through the third clock falling edge. Once the memory device begins to output data in a burst read cycle, the output drivers 34 will continue to drive the data lines without tri-stating the data outputs during clock high intervals dependent on the state of the output enable and write enable (OE* and WE*) control lines, thus allowing additional time for the system to latch the output data. Once a row and a column address are selected, additional transitions of the clock signal are used to advance the column address within the column address counter in a predetermined sequence. The time at which data will be valid at the outputs of the burst EDO DRAM is dependent only on the timing of the clock signal provided that OE* is maintained low, and WE* remains high. The output data signal levels may be driven in accordance with standard CMOS, TTL, LVTTL, GTL, or HSTL output level specifications.

The address may be advanced linearly, or in an interleaved fashion for maximum compatibility with the overall system requirements. FIG. 2 is a table which shows linear and interleaved addressing sequences for burst lengths of 2, 4 and 8 cycles. The "V" for starting addresses A1 and A2 in the table represent address values that remain unaltered through the burst sequence. The column address may be advanced with each clock transition, or each pulse. When the address is advanced with each transition of the clock signal, data is also driven from the part after each transition following the device latency which is then referenced to each edge of the clock signal. This allows for a burst access cycle where the clock toggles only once (high to low or low to high) for each memory cycle. This is in contrast to standard DRAMs which require CAS* to go low and then high for each cycle, and synchronous DRAMs which require a full clock cycle (high and low transitions) for each memory cycle.

It may be desirable to latch and increment the column address after the first clock falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is then used to select between odd and even halves while the other column address bits select a column within each of the array halves. In an interleaved access mode with column address 1, data from columns 0 and 1 would be read and the data from column 1 would be output followed by the data from column 0 in accordance with standard interleaved addressing as described in SDRAM specifications. In a linear access mode column address 1 would be applied to the odd array half, and incremented to address 2 for accessing the even array half to fulfill the two word access. One method of implementing this type of device architecture is to provide a column address incrementing circuit between the column address counter and the even array half. The incrementing circuit would increment the column address only if the initial column address in a burst access cycle is odd, and the address mode is linear. Otherwise the incrementing circuit would pass the column address unaltered. For a design using a prefetch of two data accesses per cycle, the column address would be advanced once for every two active edges of the clock signal. Prefetch architectures where more than two data words are accessed are also possible.

In the burst access memory device, each new column address from the column address counter is decoded and is used to access additional data within the memory array without the requirement of additional column addresses being specified on the address inputs 16. This burst sequence of data will continue for each clock falling edge until a predetermined number of data accesses equal to the burst length has occurred. A clock falling edge received after the last burst address has been generated will latch another column address from the address inputs 16 if CAS* is low and a new burst sequence will begin. Read data is latched and output with each falling edge of clock after the first clock latency. For a burst write cycle, data 10 is latched in input data latches 34. Data targeted at the first address specified by the row and column addresses is latched with the clock signal when the first column address is latched (write cycle data latency is zero). Other write cycle data latency values are possible; however, for today's memory systems, zero is preferred. Additional input data words for storage at incremented column address locations are latched by clock on successive clock pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent CAS* with a clock pulse will latch a new beginning column address, and another burst read or write access will begin.

The write enable signal is used in burst access cycles to select read or write burst accesses when the initial column address for a burst cycle is latched by clock. WE* low at the column address latch time selects a burst write access. WE* high at the column address latch time selects a burst read access. The level of the WE* signal must remain high for read and low for write burst accesses throughout the burst access. A low to high transition within a burst write access will terminate the burst access, preventing further writes from occurring. A high to low transition on WE* within a burst read access will likewise terminate the burst read access and will place the data output 10 in a high impedance state. Transitions of the WE* signal may be locked out during critical timing periods within an access cycle in order to reduce the possibility of triggering a false write cycle. After the critical timing period, the state of WE* will determine whether a burst access continues, is initiated, or is terminated. Termination of a burst access resets the burst length counter and places the DRAM in a state to receive another burst access command. Both RAS* and CAS* going high during a burst access will also terminate the burst access cycle placing the data drivers in a high impedance output state, and resetting the burst length counter. A minimum write enable pulse width is only required when it is desired to terminate a burst read and then begin another burst read, or terminate a burst write prior to performing another burst write with a minimum delay between burst accesses. In the case of burst reads, WE* will transition from high to low to terminate a first burst read, and then WE* will transition back high prior to the next falling edge of CAS* in order to specify a new burst read cycle. For burst writes, WE* would transition high to terminate a current burst write access, then back low prior to the next falling edge of CAS* to initiate another burst write access.

A basic implementation of the device of FIG. 1 may include a fixed burst length of 4, a fixed clock latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (OE*) to be grounded for compatibility with many SIMM module designs. When not disabled (tied to ground), OE* is an asynchronous control which will prevent data from being driven from the part in a read cycle if it is inactive (high) prior to CAS* falling and remains inactive beyond CAS* rising. If these setup and hold conditions are not met, then the read data may be driven for a portion of the read cycle. In a preferred embodiment, if OE* transitions high at any time during a read cycle the outputs will remain in a high impedance state until the next falling edge of CAS* despite further transitions of the OE* signal.

The burst access memory has been described with reference to several embodiments. Just as fast page mode DRAMs and EDO DRAMs are available in numerous configurations including ×1, ×4, ×8 and ×16 data widths, and 1 Megabit, 4 Megabit, 16 Megabit and 64 Megabit densities; the burst access memory device may take the form of many different memory organizations.

Figure 3:
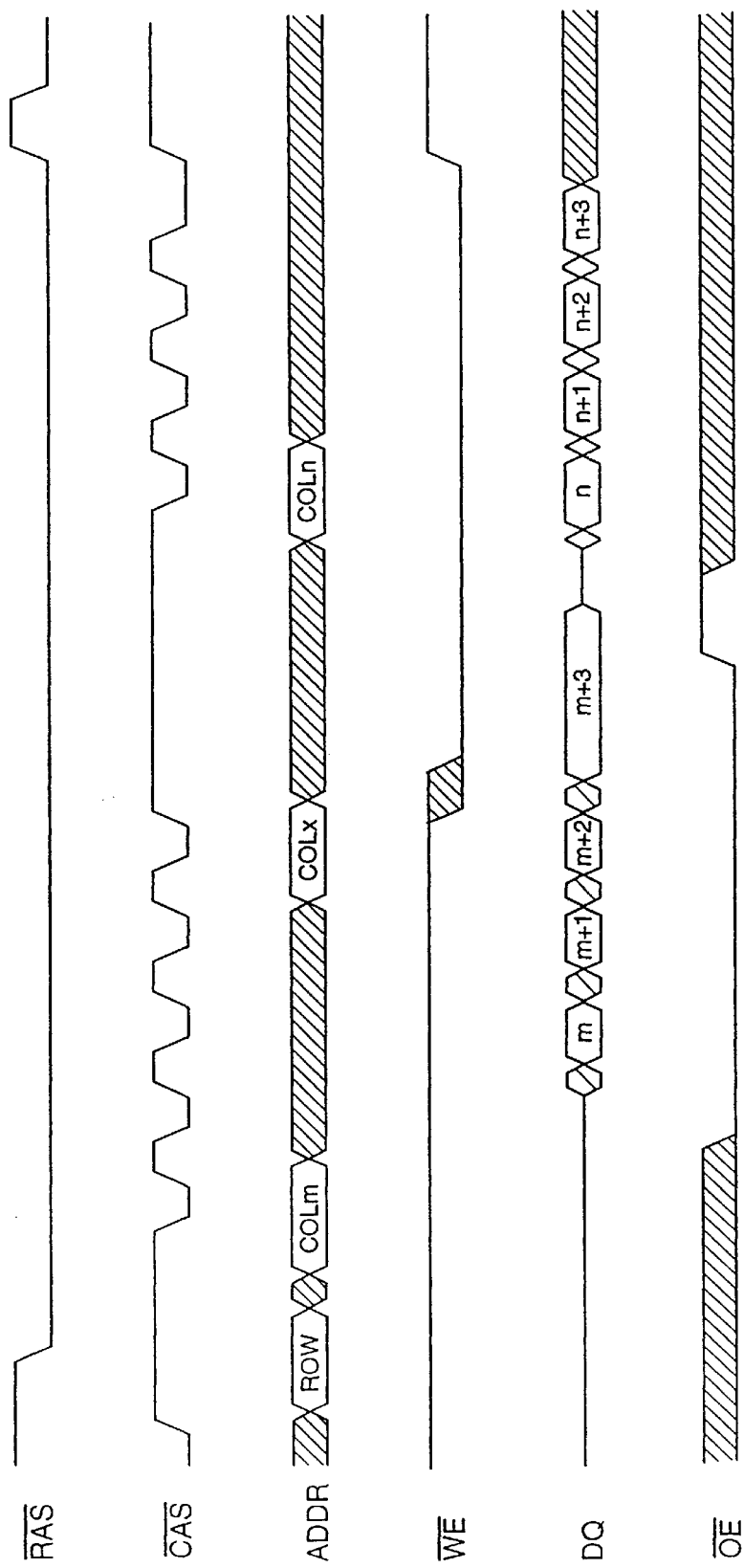
FIG. 3 is a timing diagram of a burst read followed by a burst write of the device of FIG. 1.

FIG. 3 is a timing diagram for performing a burst read followed by a burst write of the device of FIG. 1. In FIG. 3, a row address is latched by the RAS* signal. WE* is low when RAS* falls for an embodiment of the design where the state of the WE* pin is used to specify a burst access cycle at RAS* time. Next, CAS* is driven low with WE* high to initiate a burst read access, and the column address is latched. The data out signals (DQ's) are not driven in the first CAS* cycle. On the second falling edge of the CAS* signal, the internal address generation circuitry advances the column address and begins another access of the array, and the first data out is driven from the device after a CAS* to data access time (tCAC). Additional burst access cycles continue, for a device with a specified burst length of four, until the fifth falling edge of CAS* which latches a new column address for a new burst read access. WE* falling in the fifth CAS* cycle terminates the burst access, and initializes the device for additional burst accesses. The sixth falling edge of CAS* with WE* low is used to latch a new burst address, latch input data and begin a burst write access of the device. Additional data values are latched on successive CAS* falling edges until RAS* rises to terminate the burst access.

Figure 4:
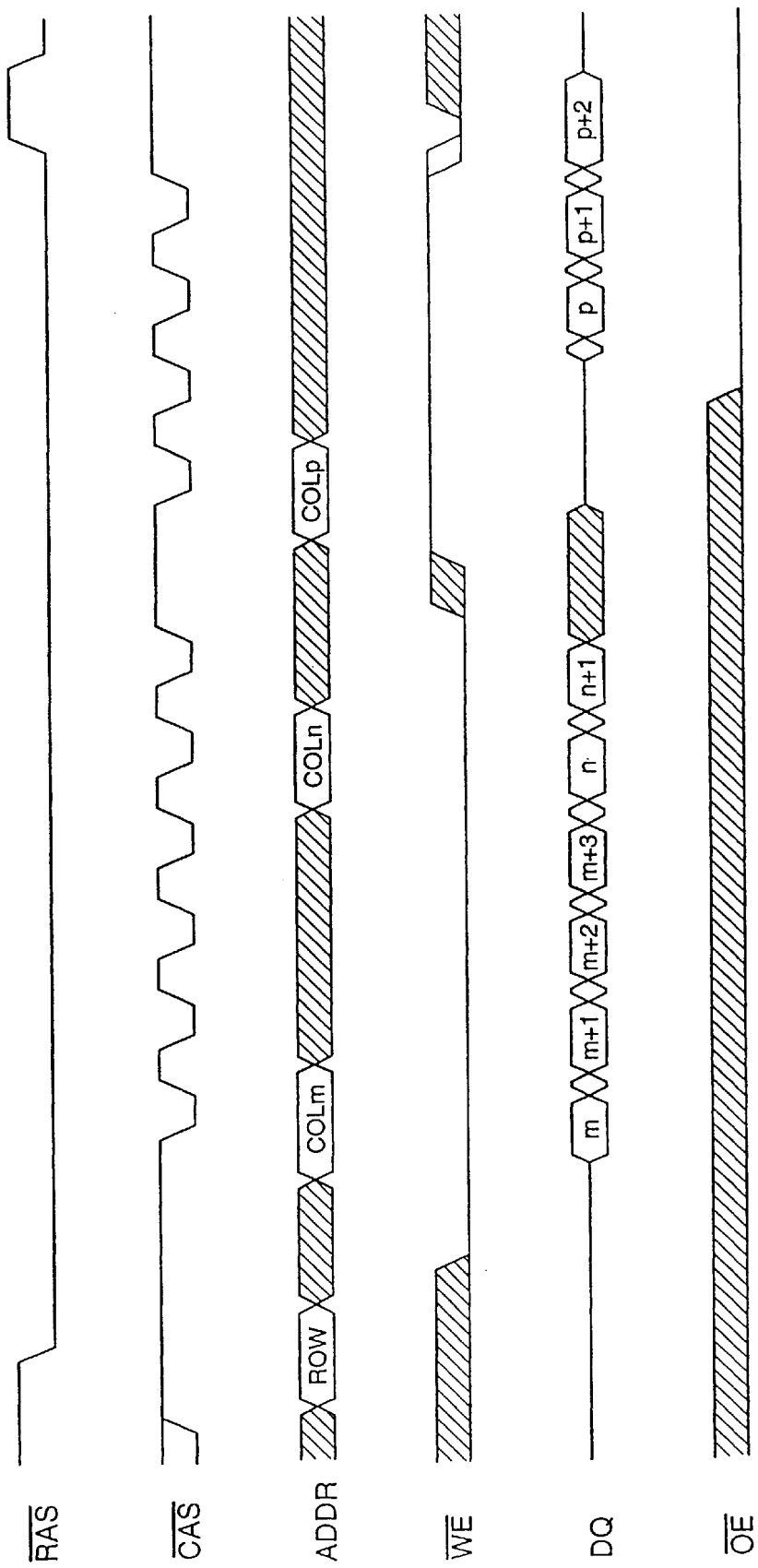
FIG. 4 is a timing diagram of a burst write followed by a burst read of the device of FIG. 1.

FIG. 4 is a timing diagram depicting burst write access cycles followed by burst read cycles. As in FIG. 3, the RAS* signal is used to latch the row address. The first CAS* falling edge in combination with WE* low begins a burst write access with the first data being latched. Additional data values are latched with successive CAS* falling edges, and the memory address is advanced internal to the device in either an interleaved or sequential manner. On the fifth CAS* falling edge a new column address and associated write data are latched. The burst write access cycles continue until the WE* signal goes high in the sixth- CAS* cycle. The transition of the WE* signal terminates the burst write access. The seventh CAS* low transition latches a new column address and begins a burst read access (WE* is high). The burst read continues until RAS* rises terminating the burst cycles.

It should be noted from Figure's 3 and 4, that for burst read cycles the data remains valid on the device outputs as long as the OE* pin is low, except for brief periods of data transition. Also, since the WE* pin is low prior to or when CAS* falls, the data input/output lines are not driven from the part during write cycles, and the OE* pin is a "don't care". Only the clock signal, CAS* and the data signals toggle at relatively high frequency, and no control signals are required to be in an active or inactive state for one clock cycle time or less. This is in contrast to SDRAMs which often require row address strobes, column address strobes, data mask, and read/write control signals to be valid for one clock cycle or less for various device functions.

SYNCHRONOUS BEDO

Figure 5:
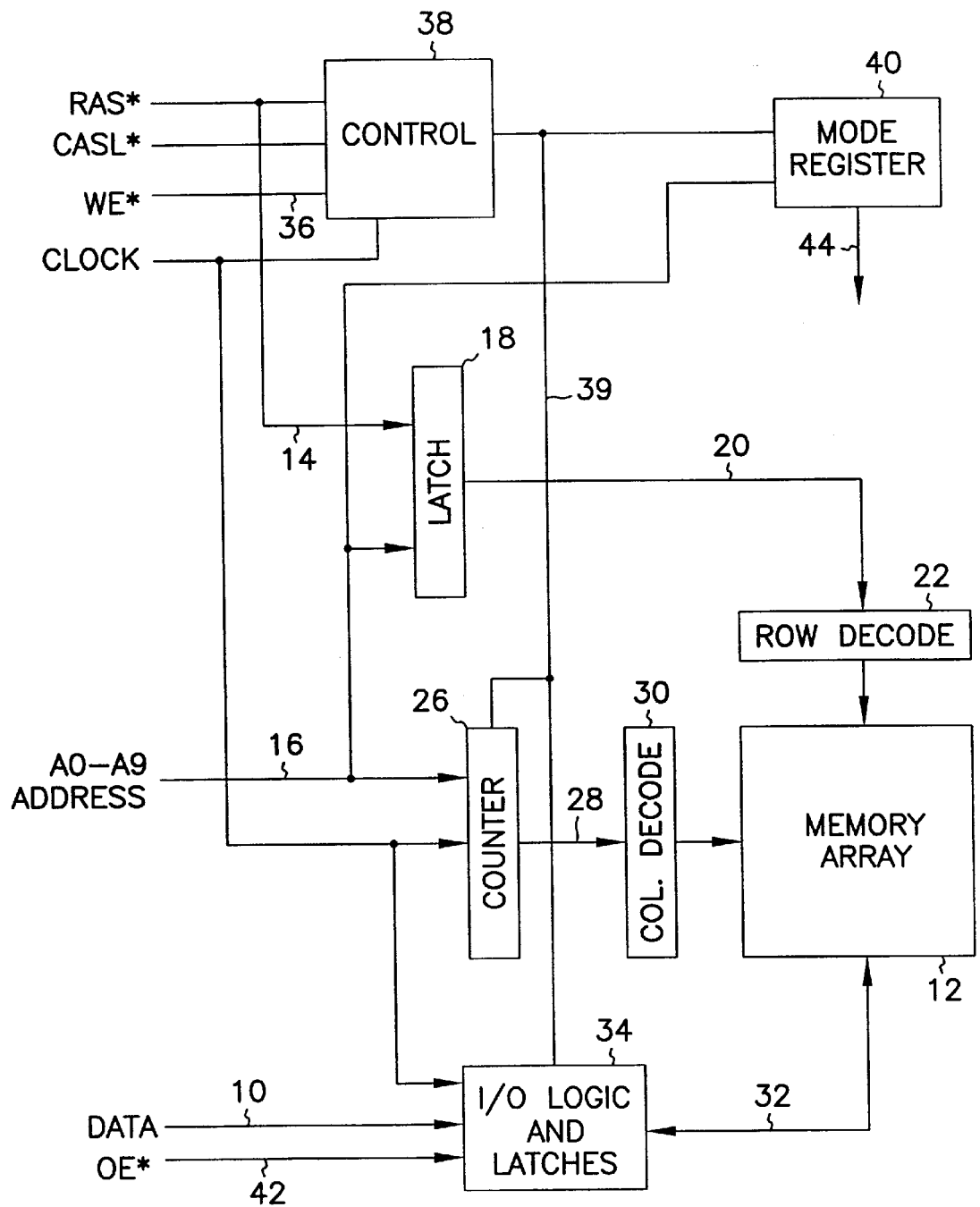
FIG. 5 is a block diagram of a memory device incorporating the features of the present invention.

A BEDO memory device has been described above as using the CAS* input to burst read or write data. It will be recognized that CAS* is a loaded line and cannot be operated efficiently at high frequencies. To reduce access time, an external clock input can be added to operate the BEDO memory in a synchronous, or clocked, mode, as illustrated in FIG. 5. In operation, the internal column address is advanced by the burst counter on the rising edge of the clock signal and the new column is accessed on the falling edge of the clock signal. The burst access memory of the present invention includes the features, options, and configurations of the memory shown in FIG. 1 and described above.

Figure 6:
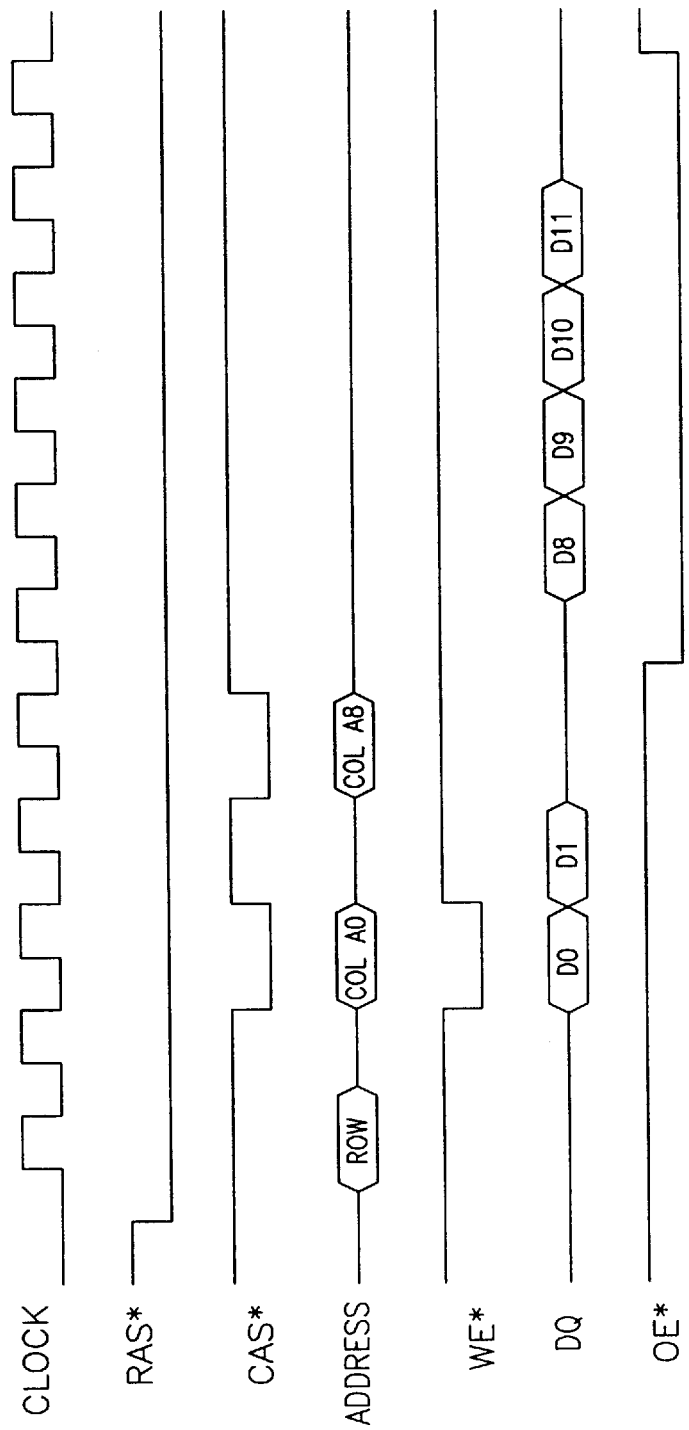
FIG. 6 is a timing diagram of the operation of the device of FIG. 5.

The operation of a synchronous BEDO can be understood in more detail with reference to the timing diagram of FIG. 6. An external memory row address is read on the first clock signal rising edge following the falling edge of RAS*. An external column address is likewise loaded into the burst counter on the first clock signal rising edge following the falling edge of CAS*. The WE* input is also examined on the rising edge of the clock signal.

As shown in the timing diagram, WE* is low during the first CAS* cycle. On the first clock signal during the CAS* cycle, column address A0 is accessed for a burst write operation. Data provided on the DQ inputs is stored at address A0. On the next clock cycle, address A1 is accessed and data presented on the DQ inputs is stored at the new address. The burst write will continue for an entire burst length unless the burst is interrupted.

Because CAS* goes low prior to the next clock cycle and WE* goes high, the burst write operation is terminated. As a result, a burst read operation is initiated. A new column address A8 is read from the external address lines. The Output Enable (OE*) signal goes low and data stored at addresses A8, A9, A10 and A11 are output on the DQ lines. FIG. 5 illustrates a memory which has a burst length of 4 and a burst read clock latency of two. It will be understood that any burst length or clock latency will work in a synchronous BEDO memory circuit.

Figure 7:
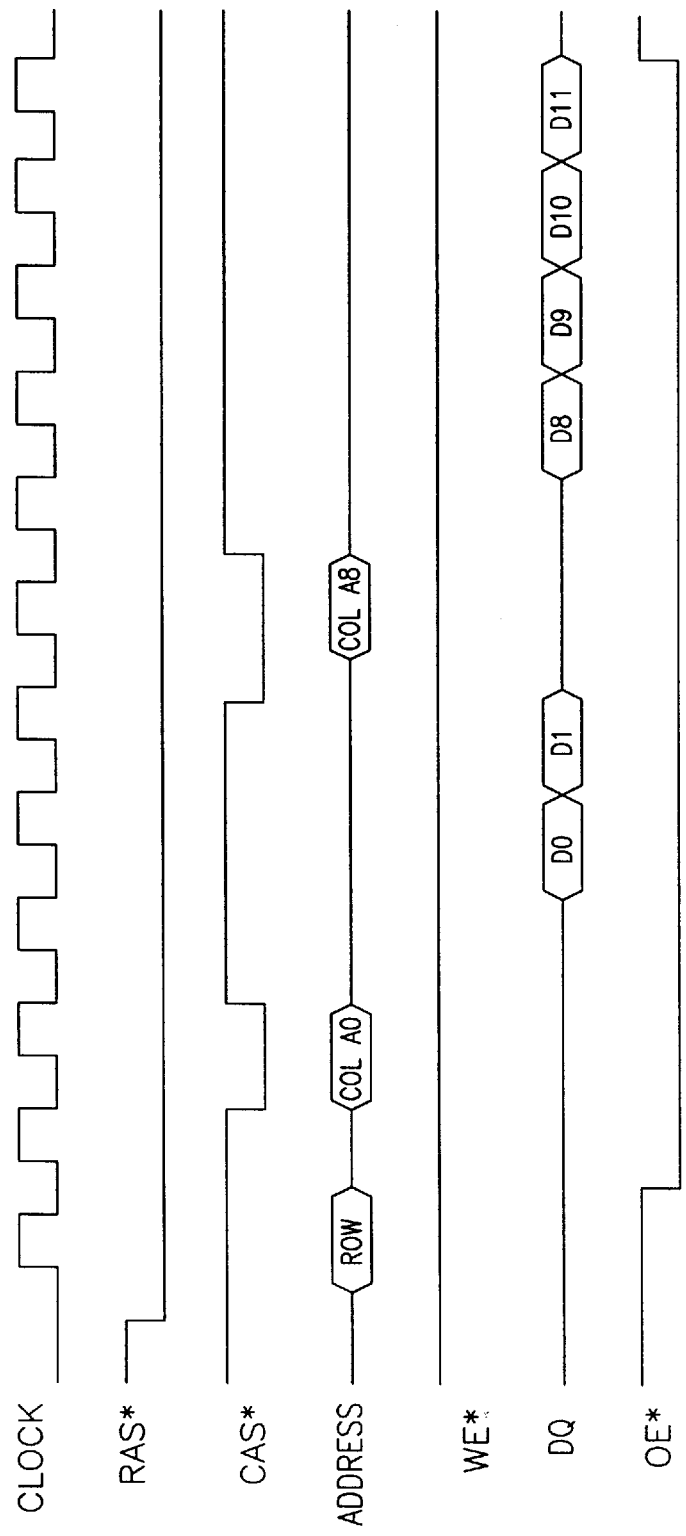
FIG. 7 is another timing diagram of the operation of the device of FIG. 5.

FIG. 7 illustrates a synchronous burst read operation followed by another synchronous burst read operation. An external memory row address is read on the first clock signal rising edge following the falling edge of RAS*. An external column address is likewise loaded into the burst counter on the first clock signal rising edge following the falling edge of CAS*. The WE* input is also examined on the rising edge of the clock signal. As shown in the timing diagram, WE* is high during the first CAS* cycle. Following a clock latency of two, data stored at column address A0 is provided on the DQ lines in response to the falling edge of the clock signal. On the next clock falling edge, address A1 is output on the DQ lines. The burst read will continue for an entire burst length unless the burst is interrupted. Because CAS* goes low during the burst operation and WE* remains high, the first burst read operation is terminated and a new burst read is initiated. A new column address A8 is read from the external address lines.

Two different synchronous BEDO memories are contemplated. The synchronous memory can be made either with an input pin dedicated to the clock signal, or the clock signal can be provided on the output enable input. This embodiment requires that the internal OE* signal be disabled by coupling to ground. Also, the OE* input pin must be rerouted to the clock function circuitry. Further, the memory operates in a non-burst mode if the CAS* signal is low. That is, when CAS* is low a new column address will be loaded from the external address lines into the burst counter on each rising edge of the clock. After an initial column address is loaded, a burst operation will be initiated on the next rising edge of the clock signal, provided that CAS* transitioned high prior to the clock signal. It will be appreciated, therefore, that a burst operation can be terminated by lowering CAS* prior to a rising transition in the clock signal. The DQ outputs go tristate after the completion of a burst if CAS* remains high.

CONCLUSION

A memory device has been described which can operate at fast data rates in a clocked or synchronous mode. The memory device is a random access memory which allows access to numerous columns of data while requiring only one external column address. A clock signal is used to synchronize access to memory elements.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the output enable (OE*) signal could be used as the clock input. That is, OE* could function as a clock, thereby eliminating the need for an additional input. Therefore, it is manifestly intended that this invention be limited only by the claims and the equivalents thereof.

What is claimed is:

1. A memory device comprising:
   a plurality of addressable memory elements;
   addressing circuitry adapted to receive a first memory element address in response to a transition of a clock signal and an address latch signal, and further adapted to generate a second memory element address in response to a subsequent transition of the clock signal, wherein the first memory element address is received on a rising edge of the clock signal when the address latch signal is low; and
   output enable circuitry for asynchronously preventing data output from the memory device in response to an externally provided output enable signal.

2. A synchronous memory device comprising:
   a memory array having a plurality of addressable memory elements;
   a plurality of address inputs for receiving memory element addresses;
   an address latch input for receiving an address latch signal;
   an address latch for receiving a first memory element address in response to a transition of a clock signal and the address latch signal;

an address generation circuit responsive to successive transitions of the clock signal and to the first memory element address for generating additional memory element addresses, the first memory element address is received on a rising edge of the clock signal when the address latch signal is low; and output enable circuitry for asynchronously preventing data output from the memory device in response to an externally provided output enable signal.

3. A method of accessing a memory device having a plurality of addressable memory elements, the method comprising the steps of:

receiving a first memory element address in response to a transition of a clock signal and an address latch signal; and generating additional memory element addresses in response to subsequent transitions of the clock signal, wherein the first memory element address is received in response to a rising transition of the clock signal when the address latch signal is at a low voltage level;

receiving an output enable signal; and asynchronously controlling data output from the synchronous memory device in response to the output enable signal.

4. A method of burst accessing a memory device having a plurality of addressable memory elements, the method comprising the steps of:

receiving a first memory element address in response to a transition of a clock signal and an address latch signal;

accessing first memory elements having the first memory element address;

generating additional memory element addresses in response to subsequent transitions of the clock signal;

accessing additional memory elements having the additional memory element addresses;

receiving an output enable signal; and asynchronously controlling data output from the synchronous memory device in response to the output enable signal.

5. A method of burst accessing a memory device having a plurality of addressable memory elements, the method comprising the steps of:

receiving a first memory element address in response to a transition of a clock signal and an address latch signal;

accessing first memory elements having the first memory element address;

generating additional memory element addresses in response to subsequent transitions of the clock signal;

accessing additional memory elements having the additional memory element addresses;

synchronously reading a memory array row address in response to an active row access signal (RAS\);

synchronously reading a memory array column address in response to an active column access signal (CAS\);

receiving an output enable signal; and asynchronously controlling data output from the synchronous memory device in response to the output enable signal.

6. A synchronous memory device comprising:

a memory array having a plurality of addressable memory elements;

a plurality of address inputs for receiving memory element addresses;

an address latch input for receiving an address latch signal;

an address latch for receiving a first memory element address in response to a transition of a clock signal and an active state of the address latch signal; and an address generation circuit responsive to successive transitions of the clock signal and to the first memory element address for generating additional memory element addresses while the address latch signal is in an inactive state, the address generation circuit including a counter circuit coupled to the address latch to enable the address latch to receive a new address from the plurality of address inputs after a predetermined number of access cycles.

7. A synchronous memory device comprising:

a memory array having a plurality of addressable memory elements;

a plurality of address inputs for receiving memory element addresses;

an address latch input for receiving an address latch signal;

an address latch for receiving a first memory element address in response to a transition of a clock signal and an active state of the address latch signal;

an address generation circuit responsive to successive transitions of the clock signal and to the first memory element address for generating additional memory element addresses while the address latch signal is in an inactive state; and the first memory element address is received on a rising edge of the clock signal when the address latch signal is low.

8. A synchronous memory device comprising:

a memory array having a plurality of addressable memory elements;

a plurality of address inputs for receiving memory element addresses;

an address latch input for receiving an address latch signal;

an address latch for receiving a first memory element address in response to a transition of a clock signal and an active state of the address latch signal;

an address generation circuit responsive to successive transitions of the clock signal and to the first memory element address for generating additional memory element addresses while the address latch signal is in an inactive state; and the additional memory element addresses are generated on rising edges of the clock signal.

9. A synchronous memory device comprising:

a memory array having a plurality of addressable memory elements;

a plurality of address inputs for receiving memory element addresses;

an address latch input for receiving an address latch signal;

an address latch for receiving a first memory element address in response to a transition of a clock signal and an active state of the address latch signal;

an address generation circuit responsive to successive transitions of the clock signal and to the first memory element address for generating additional memory element addresses while the address latch signal is in an inactive state; and an output buffer circuit adapted to drive data from the synchronous memory device, and further adapted to switch between data values in response to a falling transition of the clock signal.

10. A synchronous memory device comprising:

a memory array having a plurality of addressable memory elements;

a plurality of address inputs for receiving memory element addresses;

an address latch input for receiving an address latch signal;

an address latch for receiving a first memory element address in response to a transition of a clock signal and an active state of the address latch signal;

an address generation circuit responsive to successive transitions of the clock signal and to the first memory element address for generating additional memory element addresses while the address latch signal is in an inactive state; and a write enable input for receiving a write enable signal, and adapted to switch between read and write access cycles of the synchronous memory device and to terminate a burst access of the memory array.

11. A method of accessing a memory device having a plurality of addressable memory elements, the method comprising the steps of:

receiving a first memory element address in response to a transition of a clock signal and an active state of an address latch signal; and generating additional memory element addresses in response to subsequent transitions of the clock signal and while the address latch signal is in an inactive state, wherein the first memory element address is received in response to a rising transition of the clock signal when the address latch signal is at a low voltage level.

12. A method of accessing a memory device having a plurality of addressable memory elements, the method comprising the steps of:

receiving a first memory element address in response to a transition of a clock signal and an active state of an address latch signal; and generating additional memory element addresses in response to subsequent transitions of the clock signal while the address latch signal is in an inactive state.

13. The method of claim 12 further wherein the additional memory element addresses are generated in response to subsequent rising edges of the clock signal.

14. The method of claim 12 further including the step of:

outputting data stored at the first and additional memory element addresses in response to the clock signal.

15. The method of claim 12 further including the step of:

storing data at the first and additional memory element addresses in response to the clock signal.

16. A method of burst accessing a memory device having a plurality of addressable memory elements, the method comprising the steps of:

receiving a first memory element address in response to a transition of a clock signal and an active state of an address latch signal;

accessing first memory elements having the first memory element address;

generating additional memory element addresses in response to subsequent transitions of the clock signal while the address latch signal is in an inactive state; and accessing additional memory elements having the additional memory element addresses.

17. The method of claim 16 further comprising the steps of:

storing data at the first memory elements; and storing data at the additional memory elements.

18. The method of claim 16 further comprising the steps of:

reading data stored at the first memory elements; and reading data stored data at the additional memory elements.

* * * * *